(12) United States Patent
Canaperi et al.

(10) Patent No.: US 9,472,503 B2
(45) Date of Patent: Oct. 18, 2016

(54) ULTRATHIN SUPERLATTICE OF MNO/MN/MNN AND OTHER METAL OXIDE/METAL/METAL NITRIDE LINERS AND CAPS FOR COPPER LOW DIELECTRIC CONSTANT INTERCONNECTS

(71) Applicant: INTERNATIONAL BUSINESS MACHINES CORPORATION, Armonk, NY (US)

(72) Inventors: Donald F. Canaperi, Bridgewater, CT (US); Daniel C. Edelstein, White Plains, NY (US); Alfred Grill, White Plains, NY (US); Son V. Nguyen, Schenectady, NY (US); Takeshi Nogami, Albany, NY (US); Deepika Priyadarshini, Guilderland, NY (US); Hosadurga Shobha, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/884,193

(22) Filed: Oct. 15, 2015

(65) Prior Publication Data
US 2016/0035618 A1  Feb. 4, 2016

Related U.S. Application Data

(62) Division of application No. 14/162,993, filed on Jan. 24, 2014, now Pat. No. 9,275,952.

(51) Int. Cl.
*H01L 23/532* (2006.01)
*H01L 21/768* (2006.01)
(Continued)

(52) U.S. Cl.
CPC ... *H01L 23/53238* (2013.01); *H01L 21/76832* (2013.01); *H01L 21/76834* (2013.01); *H01L 21/76843* (2013.01); *H01L 21/76846* (2013.01);
(Continued)

(58) Field of Classification Search
CPC .................. H01L 21/76843; H01L 23/53238
See application file for complete search history.

(56) References Cited

U.S. PATENT DOCUMENTS 8,222,134 B2    7/2012 Gordon et al.
8,569,165 B2 *  10/2013 Gordon .................. C23C 16/18
                                                  257/E21.575

(Continued)

OTHER PUBLICATIONS

Jourdan et al., "Plasma Enhanced Chemical Vapor Deposition of Manganese on Low-k Dielectrics for Copper Diffusion Barrier Application," ECS Solid State Letters, 2(3), pp. 25-27 (2013).*

(Continued)

*Primary Examiner* — Thao X Le
*Assistant Examiner* — Xia L Cross
(74) *Attorney, Agent, or Firm* — Tutunjian & Bitetto, P.C.; Steven Meyers

(57) ABSTRACT

An electrical device including an opening in a low-k dielectric material, and a copper including structure present within the opening for transmitting electrical current. A liner is present between the opening and the copper including structure. The liner includes a superlattice structure comprised of a metal oxide layer, a metal layer present on the metal oxide layer, and a metal nitride layer that is present on the metal layer. A first layer of the superlattice structure that is in direct contact with the low-k dielectric material is one of said metal oxide layer and a final layer of the superlattice structure that is in direct contact with the copper including structure is one of the metal nitride layers.

8 Claims, 6 Drawing Sheets

(51) Int. Cl.
  *H01L 29/872* (2006.01)
  *H01L 29/739* (2006.01)
  *H01L 23/528* (2006.01)
  *H01L 21/285* (2006.01)

(52) U.S. Cl.
  CPC ... *H01L 21/76849* (2013.01); *H01L 21/76879* (2013.01); *H01L 23/528* (2013.01); *H01L 29/7395* (2013.01); *H01L 29/872* (2013.01); *H01L 21/28556* (2013.01); *H01L 2924/0002* (2013.01)

(56) References Cited

U.S. PATENT DOCUMENTS

| | | | | |
|---|---|---|---|---|
| 2009/0120787 | A1* | 5/2009 | Okamura | C23C 14/046 204/192.25 |
| 2010/0323512 | A1* | 12/2010 | Matsumoto | C23C 16/40 438/608 |
| 2011/0171826 | A1 | 7/2011 | Huang | |
| 2013/0273733 | A1* | 10/2013 | Tang | H01L 21/76843 438/643 |
| 2013/0292806 | A1* | 11/2013 | Ma | H01L 29/06 257/632 |
| 2014/0008812 | A1* | 1/2014 | Emesh | H01L 21/76882 257/774 |
| 2014/0183743 | A1* | 7/2014 | Matsumoto | H01L 21/67207 257/751 |
| 2015/0108646 | A1* | 4/2015 | Chae | H01L 23/5226 257/751 |

OTHER PUBLICATIONS

Kudo et al., "Ultrathin Barrier Formation Using Combination of Manganese oxide Encapsulation and Self-Aligned Copper Silicon Nitride Barriers for Copper Wiring in Future LSI Interconnects," IEEE Transactions on Electron Devices, vol. 58, No. 10. pp. 3369-3378 (2011).*

Matsumoto et al., "Chemical Vapor Deposition of Mn and Mn Oxide and Their Step Coverage and Diffusion Barrier Properties on Patterned Interconnect Structures," Applied Physics Express 2 (2009) 036503.*

Au, Y., et al. "Filing Narrow Trenches by Iodine-Catalyzed CVD of Copper and Manganese on Manganese Nitride Barrier/Adhesion Layers". Journal of the Electrochemical Society. Mar. 2011. pp. D248-D253. vol. 158, Issue 5.

Au, Y., et al. "Selective Chemical Vapor Deposition of Manganese Self-Aligned Capping Layer for Cu Interconnections in Microelectronics". Journal of the Electrochemical Society. Apr. 2010. pp. D341-D345. vol. 157, Issue 6.

Gorgon, R., et al. "Chemical Vapor Deposition (CVD) of Manganese Self-Aligned Diffusion Barriers for Cu Interconnections in Microelectronics". Advanced Metallization Conference 2008 (AMC 2008). Sep. 2008. pp. 1-9.

Haneda, M., et al. "Restraint of Copper Oxidation Using Barrier Restoration Technique with Cu-Mn Alloy". Japanese Journal of Applied Physics. May 2010. 4 Pages. vol. 49. Issue 5.

Jourdan, N., et al."Study of Chemical Vapor Deposition of Manganese on Porous SiCOH Low-k Dielectrics Using Bis(ethylcyclopentadienyl)manganese". Electrochemical and Solid-State Letters. Mar. 2012. pp. H176-H178. vol. 15. Issue 5.

Jourdan, N., et al."Plasma Enhanced Chemical Vapor Deposition for Manganese on Low-k Dielectrics for Copper Diffusion Barrier Application". Electrochemical and Solid-State Letters. Dec. 2012. pp. P25-P27. vol. 2. Issue 3.

Kudo, H., et al. "Ultrathin Barrier Formation Using Combination of Manganese Oxide Encapsulation and Self-Aligned Copper Silicon Nitride Barriers for Copper Wiring in Future LSI Interconnects". IEEE Transactions on Electron Devices. pp. 3369-3378. vol. 58. Issue 10.

Matsumoto, K., et al. "Chemical Vapor Deposition of Mn and Mn Oxide and their Step Coverage and Diffusion Barrier Properties on Patterned Interconnect Structures". Applied Physics Express. Mar. 2009. 3 Pages. vol. 2. Issue 3.

* cited by examiner

ULTRATHIN SUPERLATTICE OF MNO/MN/MNN AND OTHER METAL OXIDE/METAL/METAL NITRIDE LINERS AND CAPS FOR COPPER LOW DIELECTRIC CONSTANT INTERCONNECTS

BACKGROUND

1. Technical Field

The present disclosure relates to interconnect devices and structures for transmitting electrical current.

2. Description of the Related Art

As the technology node advances in semiconductor devices, RC delay is a major factor determining the performance of large scale integrated circuits. Use of copper (Cu) in integrated circuits reduces the line resistance, but an efficient barrier layer in preferred to prevent diffusion of copper (Cu) into the low-k dielectric typically used as a substrate and interlevel dielectric layer material.

SUMMARY

In one embodiment, an electrical device is provided that includes an opening in a low-k dielectric material, wherein a copper including interconnect is present within the opening. A composite liner is present between the low-k dielectric material and the copper including interconnect. The composite liner includes a manganese oxide layer that is in direct contact with the low-k dielectric material, a manganese layer present on the manganese oxide layer, and a manganese nitride layer that is present on the manganese layer and in direct contact with the copper including interconnect.

In another embodiment, an electrical device is provided that includes an opening in a low-k dielectric material, and a copper including structure that is present within the opening for transmitting electrical current. A liner is present between the opening and the copper including structure. The liner includes a superlattice structure composed of a metal oxide layer, a metal layer present on the metal oxide layer, and a metal nitride layer that is present on the metal layer. A first layer of the superlattice structure that is in direct contact with the low-k dielectric material is one of the metal oxide layers. A final layer of the superlattice structure that is in direct contact with the copper including structure is one of the metal nitride layers. At least one of the metal oxide layer, the metal layer and the metal nitride layer has a composition including manganese (Mn).

In another aspect of the present disclosure, a method for forming an interfacial layer between a low-k dielectric material and a copper including structure is provided that includes forming a superlattice structure on the low-k dielectric material. The superlattice structure includes a repeating sequence of a metal oxide layer, a metal layer and a metal nitride layer. At least one of the metal oxide layer, the metal layer and the metal nitride layer includes manganese (Mn). A first layer of the superlattice structure that is in direct contact with the low-k dielectric material is one of the metal oxide layers. A copper including structure may then be formed on a metal nitride layer of the superlattice structure.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
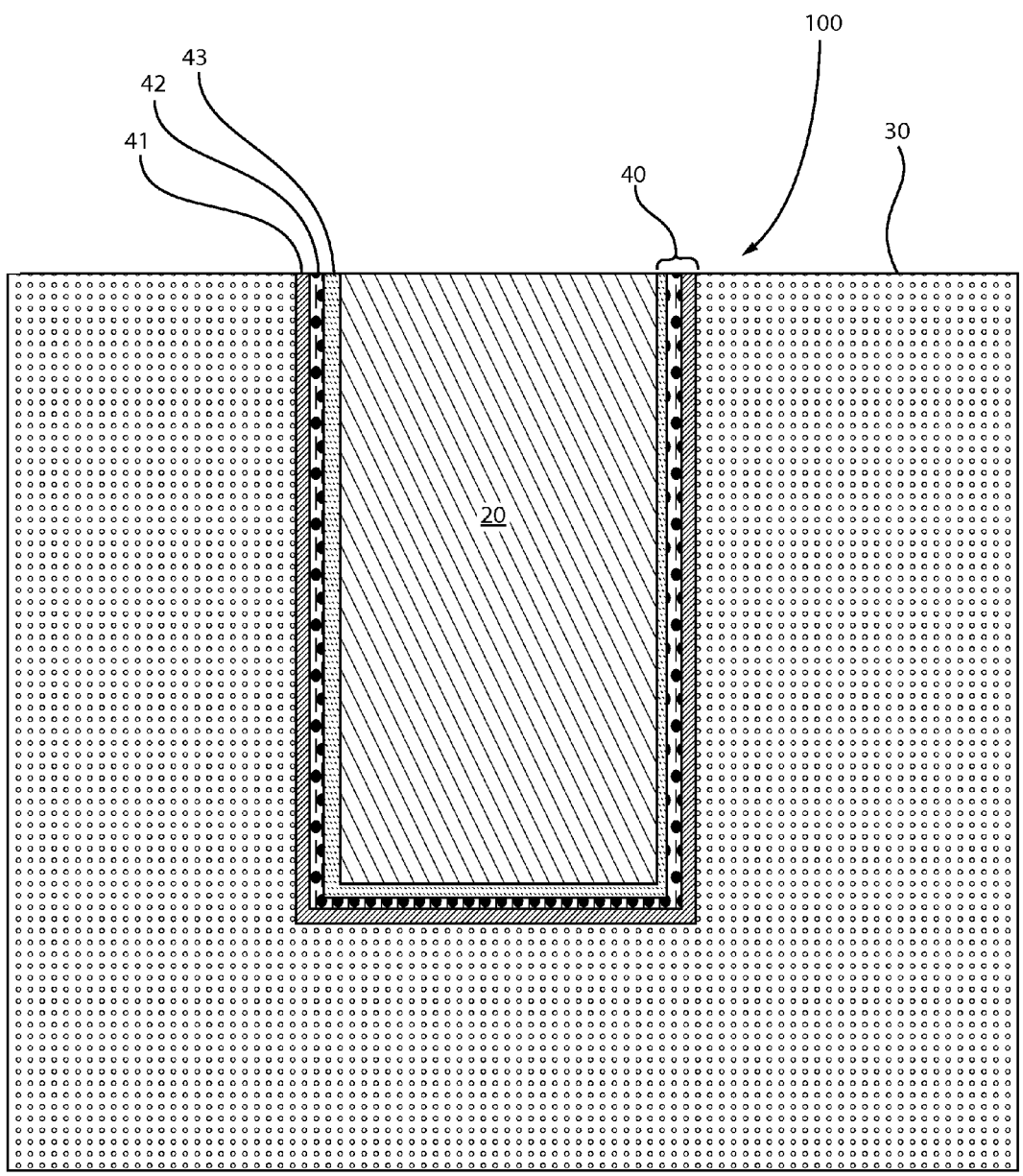
FIG. 1 is a side cross-sectional view of an interconnect that is present in a low-k dielectric material, where a composite liner including at least one layer containing manganese is present between a copper including structure of the interconnect and the low-k dielectric material, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Copper (Cu) is an effective material for use in interconnect structures, but typically requires a barrier layer to obstruct the copper (Cu) from being diffused into surrounding low-k dielectric materials. It has been determined that the barrier layer of prior interconnect structures is composed of a high resistivity material. The material of the barrier layer needs to be carefully selected, because if the barrier layer is too thick then it takes up a portion of the copper (Cu) line and increases the effective line resistance. If the barrier layer is too thin, then it will not act as an efficient copper barrier. A barrier layer that is too thin can affect device performance and result in poor reliability (EM, stress induced voiding and time dependent dielectric breakdown (TDDB) of the dielectric, due to both diffusive leakage of oxygen or water molecules through the barrier to corrode the copper, and due to copper neutrals or ions diffusing out of the barrier and through the insulator regions). Further, as the device size shrinks, the barrier layer and the cap layer for an interconnect structure also shrinks, i.e., becomes thinner, while still needing to retain barrier properties.

For example, nano Cu-pSiCOH (porous or ultra low k SiCOH) processing may include different films for different applications in a via or trench. In order to meet the needs of future technology nodes, there is a requirement for thinner, multi-layer films with intermixing between layers for optimal individual performance of each layer and providing enhanced copper (Cu) oxidation/diffusion and moisture barrier properties, as well as providing an adhesion promoter and seed layer for copper (Cu) growth. Further, tantalum (Ta)/tantalum nitride (TaN) liners that have been used in trench and via structures during back end of the line (BEOL) processing are reaching their thickness scaling limitations.

The methods and stuctures disclosed herein provide thinner films than previously employed as barrier layers that have multiple properties, such as the ability to function as a barrier to copper (Cu) diffusion, the ability to function as an oxygen barrier, as well as functioning as an adhesion promoter. Manganese oxide ($MnO_x$) liners have been identified as a barrier to copper (Cu) diffusion. Conducting manganese nitride ($MnN_x$) has been identified as a potential substitute for tantalum nitride (TaN).

In some embodiments, the present disclosure provides a composite liner and cap structure for providing a diffusion barrier to copper and oxygen, as well as an adhesion promoter to copper, in which the composite liner and cap structure may include a sequence of a metal oxide/metal/metal nitride barrier layer. In one example, the composite structure provided for a liner and/or cap structure to a copper including structure includes a sequence of layers that includes a manganese oxide ($MnO_x$) layer, a manganese (Mn) layer, and a manganese nitride ($MnN_y$) layer. In some examples, each of these layers may have a thickness of 1 atomic/molecular layer or greater to maintain their functionality.

In some embodiments, the present disclosure provides a superlattice liner/barrier/cap structure for improved diffusion barrier properties. As used herein, the term "superlattice" denotes a layered structure of at least two layers, e.g., three layers, of differing material composition that are in a repeating sequence. For example, if the three layers of differing material composition includes compositions "A", "B" and "C", a superlattice structure may include a layer sequence of composition A, composition B, composition C, composition A, composition B, composition C, composition A, composition B, composition C, etc. In some embodiments, the superlattice structure includes a metal oxide layer as a diffusion barrier to copper; a metal layer as an oxygen getter, diffusion barrier, seed layer and adhesion layer; and metal nitride layer as an adhesion layer and a copper and oxygen diffusion barrier. In one example, the superlattice structure used in the liner and cap structure includes single and repeating units, i.e., multilayers, of metal oxide/metal/metal nitride with thickness for each layer of 4 Å to 20 Å. In one example, the superlattice structure comprises manganese oxide, manganese and manganese nitride. Some embodiments of the methods and structures disclosed herein, are now described in more detail with reference to FIGS. 1-8.

FIG. 1 depicts one embodiment of an interconnect structure 100 including a composite liner 40 between a copper including structure 20 and a low-k dielectric material 30, wherein the composite liner 40 may function as at least one of a diffusion barrier for obstructing copper from diffusing into the low-k dielectric material 30, a diffusion barrier for obstructing oxygen from diffusing into the copper including structure 20, and an adhesion promoter between the copper including structure 20 and the low-k dielectric material 30. The term "interconnect" denotes a conductive structure that transmits an electrical signal, e.g., electrical current, from one portion of a device to at least a second portion of the device. The interconnect may provide for electrical communication in a vertical direction, i.e., along a plane extending from the top to bottom, of a device including stacked material layers providing a plurality of levels within a device. In this manner, the interconnect may be present in a via. The interconnect may also provide for electrical communication in a horizontal direction, i.e., along a plane that is planar to an upper surface of the substrate, e.g., the low-k dielectric material 30. In this manner, the interconnect may be a metal line and/or wiring.

The interconnect structure 100 that is depicted in FIG. 1 may be employed in any electrical device. For example, the interconnect structures that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Referring to FIG. 1, the copper including structure 20 of the interconnect structure may be composed of a copper including material. In one embodiment, the copper including material is a pure copper, i.e., 100 at. % copper. The pure copper may include incidental oxidation of the copper. In another embodiment, the copper including material is a mixture of copper and one or more other metals. A copper-metal mixture can be a heterogeneous mixture, or alternatively, a homogeneous mixture, such as an alloy. Some alloys of copper include copper-tantalum, copper-manganese, copper-aluminum, copper-titanium, copper-platinum, copper-zinc, copper-nickel, and copper-silver alloys. Generally, the alloys considered herein contain copper in an amount of at least 40% by weight of the alloy, and more generally, at least 50%, 60%, 70%, 80%, 90%, 95%, 97%, 98%, or 99% by weight of the alloy. It is noted that any composition including copper may be employed for the copper including structure 20, so long as the composition is electrically conductive. "Electrically conductive" as used through the present disclosure means a material typically having a room temperature conductivity of greater than $10^{-8}$ $(\Omega\text{-m})^{-1}$.

The copper including structure 20 provides an electrically conductive portion of the interconnect structure 100. In FIG. 1, the copper including structure 20 is present in an opening that is formed in a low-k dielectric material 30. Although FIG. 1, depicts that the copper including structure 20 terminates at a base within the low-k dielectric material 30, the present disclosure is not limited to only this embodiment. For example, the copper including structure 20 may extend to another electrically conductive material, such as another interconnect structure, e.g., metal line or via, where a base portion of the liner 40 may be present at the interface of the base of the copper including structure 20 and the other electrically conductive material. In other examples, the copper including structure 20 may extend to a semiconductor structure, such as a doped, e.g., n-type or p-type conductivity, portion of the semiconductor substrate, wherein a base portion of the liner 40 may be present at the interface of the base of the copper including structure 20 and the semiconductor material.

The term "low-k" as used to describe the low-k dieleectric material 30 denotes a material having a dielectric constant that is less than silicon dioxide at room temperature (e.g., 25° C.). In one embodiment, the low-k dielectric material 30 has a dielectric constant that is less than 4.0, e.g., 3.9. In another embodiment, the low-k dielectric material 30 may have a dielectric constant ranging from 1.75 to 3.5. In yet another embodiment, the low-k dielectric material 30 may have a dielectric constant ranging from 2.0 to 3.2. In yet an even further embodiment, the low-k dielectric material 30 may have a dielectric constant ranging from 2.25 to 3.0. In yet another embodiment, the low-k dielectric material 30 has a dielectric constant ranging from about 1.0 to about 3.0.

Examples of materials suitable for the low-k dielectric material 30 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ), undoped silica glass, diamond like carbon (DLC), methylsilsesquioxane (MSQ) and combinations thereof. The low-k dielectric material 30 may be porous or non-porous.

Referring to FIG. 1, a composite liner 40 may be present between the low-k dielectric material 30 and the copper including structure 20. The composite liner 40 typically includes a metal oxide layer 41 that is in direct contact with the low-k dielectric material 30, a metal layer 42 that is present on the metal oxide layer 41, and a metal nitride layer 43 that is in direct contact with the copper including structure 20. In some embodiments, an additional diffusion barrier, e.g., copper and/or oxygen diffusion barrier, may be present between the metal layer 42 and at least one of the metal oxide layer 41 and the metal nitride layer 43. The additional diffusion barrier may be an oxide of the metal from the metal layer 42. For example, the additional diffusion barrier may be composed of manganese oxide, when the metal layer 42 is composed of manganese.

In some embodiments, the metal oxide layer 41 may function as a copper (Cu) diffusion barrier. More specifically, the metal oxide layer 41 may obstruct copper (Cu) from diffusing from the copper including structure 20 to the low-k dielectric material 30. The metal layer 42 may function as an oxygen getter, copper (Cu) and oxygen (O) diffusion barrier, seed layer and adhesion promoter. An oxygen getter is a material that reacts with oxygen to form an oxide. In some embodiments, elemental metal from the metal layer 42 diffuses into contact with oxygen that may be present in the composite liner 40 reacting with the oxygen as a getter material in forming a metal oxide layer, e.g., manganese oxide. The metal oxide layer may be formed between the metal layer 42 and one of the metal oxide layer 41 and the metal nitride layer 43 forming an additional diffusion barrier that obstructs further diffusion of oxygen through the composite liner 40. The metal nitride layer 43 may function as a copper and oxygen diffusion barrier, as well as functioning as an adhesion promoter between the copper including structure 20 and the composite liner 40. More specifically, the metal nitride layer 43 obstructs oxygen from diffusing from the low-k dielectric material 30 into the copper including structure 20. Each of the metal oxide layer 41, the metal layer 42 and the metal nitride layer 43 may have a thickness ranging from 1 Å to 10 Å. In another embodiment, each of the metal oxide layer 41, the metal layer 42 and the metal nitride layer 43 may have a thickness ranging from 2 Å to 5 Å.

At least one of the layers in the composite liner 40 includes manganese (Mn). In some embodiments, the metal oxide layer 41 of the composite liner 40 includes a metal element selected from the group consisting of manganese (Mn), tantalum (Ta), aluminum (Al), cobalt (Co), ruthenium (Ru) and combinations thereof. For example, the metal oxide layer 41 may be composed of a manganese oxide, such as manganese (II) oxide (MnO), manganese (II, III) oxide ($Mn_3O_4$), manganese (III) oxide ($Mn_2O_3$), manganese dioxide (manganese (IV) oxide) ($MnO_2$), manganese (VII) oxide ($Mn_2O_7$) and combinations thereof. In other embodiments, the metal oxide layer 41 may be composed of tantalum oxide, aluminum oxide, ruthenium oxide and combinations thereof.

The metal layer 42 is typically composed of manganese (Mn). For example, the metal layer 42 may be composed of 100 at. % manganese (Mn). In another example, the metal layer 42 is a mixture of manganese and one or more other metals. A manganese-metal mixture can be a heterogeneous mixture, or alternatively, a homogeneous mixture, such as an alloy. Some metal elements that may be alloyed with manganese include tantalum (Ta), aluminum (Al), cobalt (Co), ruthenium (Ru), iron (Fe) and combinations thereof. Generally, the alloys considered herein contain manganese in an amount of at least 40% by weight of the alloy, and more generally, at least 50%, 60%, 70%, 80%, 90%, 95%, 97%, 98%, or 99% by weight of the alloy. Other additives that may be present within a metal layer 42 that is composed of manganese include silicon (Si), nitrogen (N), boron (B), titanium (Ti), phosphorus (P) and combinations thereof.

The metal nitride layer 43 may include a metal element selected from the group consisting of manganese (Mn), tantalum (Ta), aluminum (Al), cobalt (Co), ruthenium (Ru) and combinations thereof. Typically, the metal nitride layer 43 is composed of manganese nitride. Examples of manganese nitride include $Mn_4N$, $Mn_2N$, $Mn_3N$ and combinations thereof.

Figure 2:
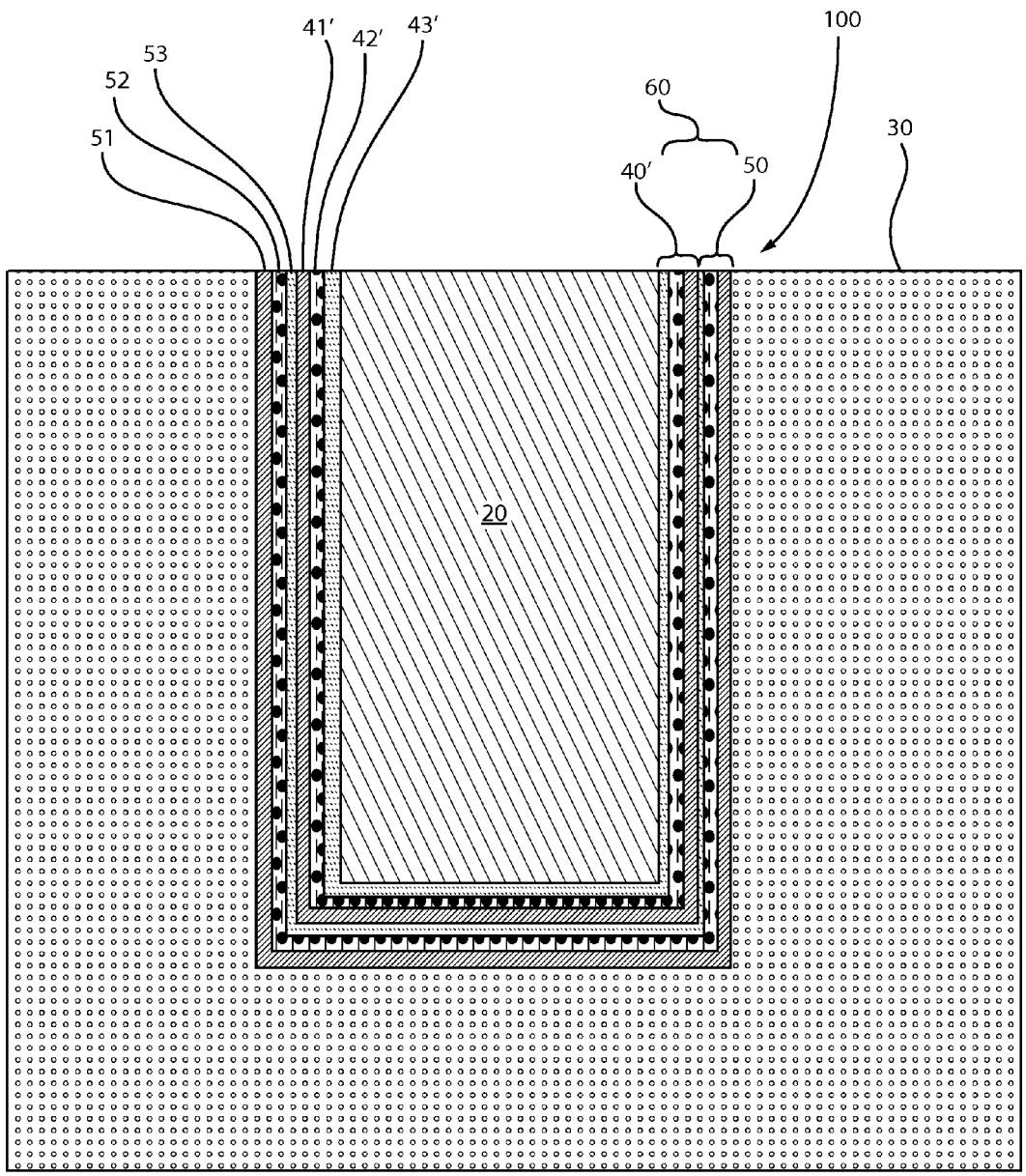
FIG. 2 is a side cross-sectional view of an interconnect that is present in a low-k dielectric material, in which a superlattice structure including at least one layer containing manganese is repeated between the copper including structure of the interconnect and the low-k dielectric material, in accordance with one embodiment of the present disclosure.

In the embodiment, that is depicted in FIG. 1, the composite liner 40 includes one sequence of a metal oxide layer 41 that is in direct contact with the low-k dielectric material 30, a metal layer 42 that is present on the metal oxide layer 41, and a metal nitride layer 43 that is in direct contact with the copper including structure 20. The present disclosure is not limited to only this embodiment. For example, the sequence of the metal oxide layer 41, metal layer 42 and the metal nitride layer 43 may be repeated at least once to provide a liner that includes a superlattice structure 60 between the low-k dielectric material 30 and the copper including structure 20, as depicted in FIG. 2. In some embodiments, the superlattice structure 60 includes at least one additional sequence 50 of a metal oxide layer 51, a metal layer 52 and a metal nitride layer 53 between the low-k dielectric material 30 and the copper including structure 20.

Referring to FIG. 2, the first sequence 40' of the metal oxide layer 41', the metal layer 42' and the metal nitride layer 43' is similar to the material layers included in the composite liner 40 that is depicted in FIG. 1. Therefore, the description of metal oxide layer 40 depicted in FIG. 1 is suitable for the metal oxide layer 41' depicted in FIG. 2; the description of the metal layer 42 depicted in FIG. 1 is suitable for the metal layer 42' that is depicted in FIG. 2; and the description of the metal nitride layer 43 that is depicted in FIG. 1 is suitable for the metal nitride layer 43' that is depicted in FIG. 2. For example, the metal oxide layer 41' may be manganese oxide, the metal layer 42' may be manganese, and the metal nitride layer 43' may be manganese nitride.

The metal oxide layer 51 of the at least one additional sequence 50, i.e., repeated sequence, is similar to the metal oxide layer 41 that is described above with reference to FIG. 1. Therefore, the description of metal oxide layer 41 depicted in FIG. 1 is suitable for the metal oxide layer 51 of the at least one additional sequence 50, i.e., repeated sequence, that is depicted in FIG. 2. For example, the metal oxide layer 51 may be composed of manganese oxide. The metal layer 52 of the at least one additional sequence 50, i.e., repeated sequence, is similar to the metal layer 42 that is described above with reference to FIG. 1. Therefore, the description of metal layer 42 depicted in FIG. 1 is suitable for the metal layer 52 of the at least one additional sequence 50, i.e., repeated sequence, that is depicted in FIG. 2. For example, the metal layer 52 may be manganese. The metal nitride layer 53 of the at least one additional sequence 50, i.e., repeated sequence, is similar to the metal nitride layer 43 that is described above with reference to FIG. 1. Therefore, the description of metal nitride layer 43 depicted in FIG. 1 is suitable for the metal nitride layer 53 of the at least one additional sequence 50, i.e., repeated sequence, that is depicted in FIG. 2. For example, the metal nitride layer 53 may be composed of manganese nitride.

Although only one additional sequence 50, i.e., repeated sequence, is depicted in FIG. 2, the present disclosure is not limited to only this embodiment. For example, the at least one additional sequence 50 may be any number of deposited sequences of metal oxide layer, metal layer, and metal nitride layer. For example, the sequence may be repeated 3 times, 4 times, 5 times, 6 times, etc., so long as the material layer of the superlattice structure 60 that is in direct contact with the low-k dielectric layer 30 is a metal oxide layer 51, such as manganese oxide, and the material layer of the superlattice structure 60 that is in direct contact with the copper including structure 20 is a metal nitride layer 43', such as manganese nitride.

The total thickness of the superlattice structure 60 including the first sequence 40' and the at least one additional sequence 50, i.e., repeated sequence, of the metal oxide layer 41', 51, metal layer 42', 52 and the metal nitride layer 43', 53 may range from 3 Å to 300 Å, in which the normal range is from 5 Å to 50 Å. In another embodiment, the total thickness of the superlattice structure 60 including the first sequence 40' and the at least one additional sequence 50, i.e., repeated sequence, of the metal oxide layer 41', 51, metal layer 42', 52 and the metal nitride layer 43', 53 may range from 3 Å to 300 Å, in which the normal range is from 5 Å to 50 Å.

Figure 3:
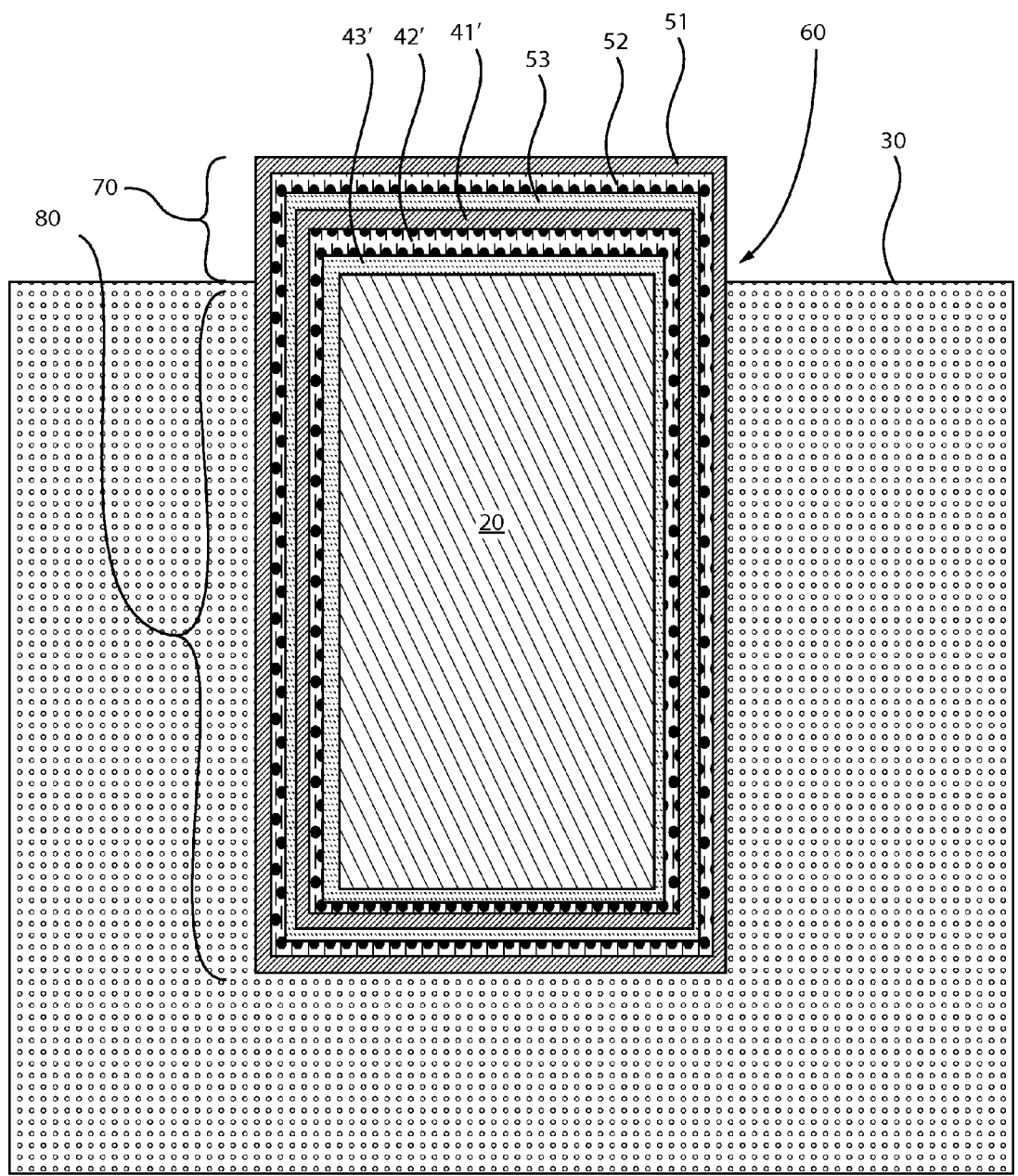
FIG. 3 is a side cross-sectional view of an interconnect that is present in a low-k dielectric, wherein a superlattice structure including at least one layer containing manganese is present between the copper including structure of the interconnect and the low-k dielectric material, wherein the superlattice structure is present as a cap on the copper including structure, in accordance with one embodiment of the present disclosure.

FIG. 3 depicts one embodiment of a copper including interconnect that is present in a low-k dielectric material 30, wherein a superlattice structure 60 including at least one layer containing manganese is present between the copper including structure 20 and the low-k dielectric material 30, wherein the superlattice structure 60 is also present as a cap 70 on the copper including structure 20. The material layers for the superlattice structure 60 depicted in FIG. 3 are similar to the material layers of the superlattice structure 60 depicted in FIG. 2. For example, the metal oxide layers 41', 51 may be composed of manganese oxide; the metal layers 42', 52 may be composed of manganese; and the metal nitride layers 43', 53 may be composed of manganese nitride.

The portion of the superlattice structure 60 that provides the cap 70 is present on an upper surface of the copper including structure 20, and may function as a barrier to oxygen from the atmosphere that can cause oxidation of the copper including structure 20. In the embodiment, that is depicted in FIG. 3, the liner portion 80 of the superlattice structure 60 and the portion of the superlattice structure 60 that provides the cap 70 encapsulate the copper including structure 20. Although, FIG. 3 depicts a liner composed of a superlattice structure 60, embodiments have been contemplated in which the cap 70 and the liner 80 are composed of a single sequence of a metal oxide layer, a metal layer, and a metal nitride layer, as described above in FIG. 1.

Figure 4:
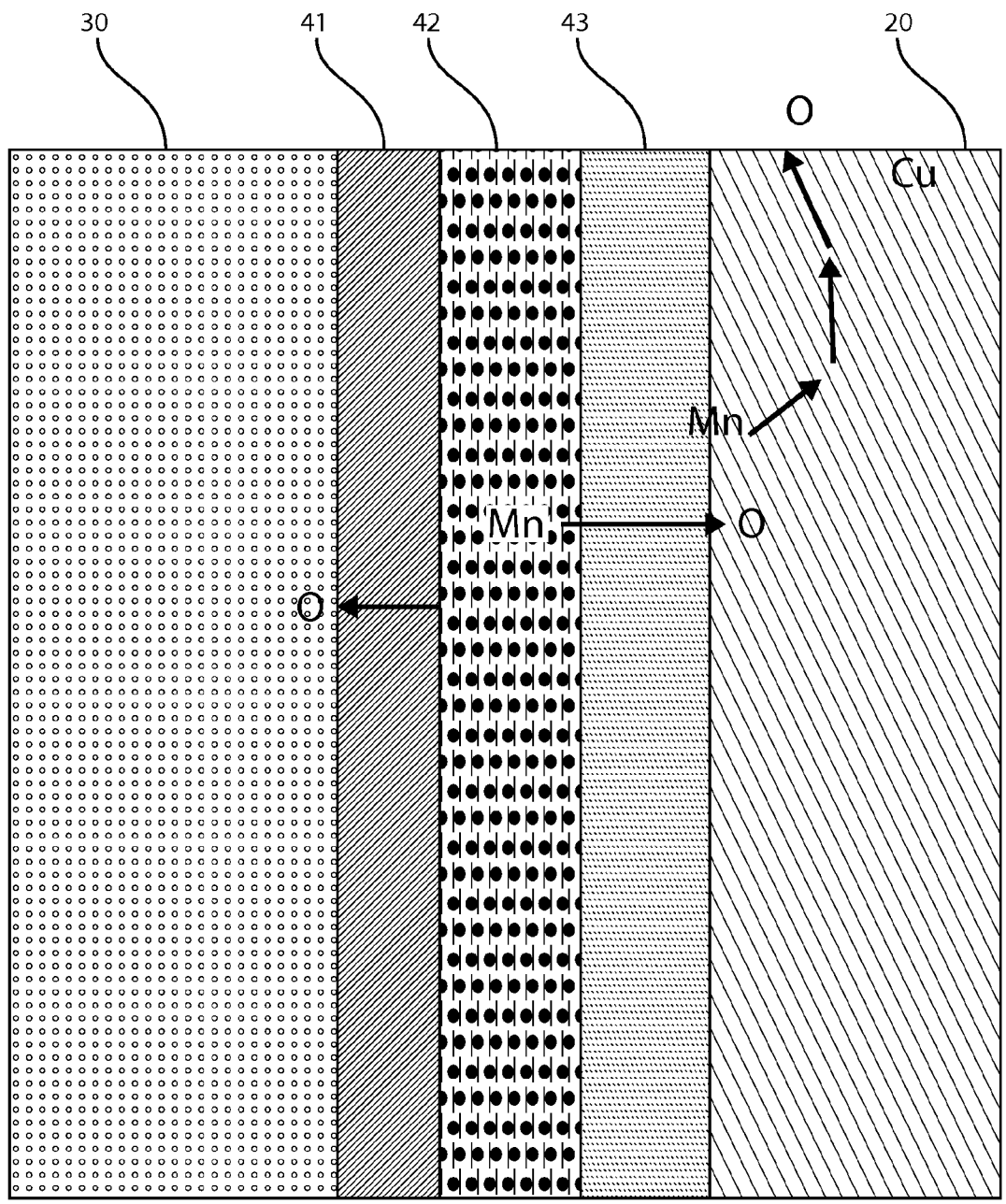
FIG. 4 is a magnified side cross-sectional view of the composite liner at the interface of the low-k dielectric material and the copper including structure of the interconnect, in accordance with one embodiment of the present disclosure.

FIG. 4 is a magnified view of one embodiment of a composite liner 40 at the interface of the low-k dielectric material 30 and the copper including structure 20 of the interconnect, depicting the diffusion of the manganese that may be present in the metal oxide layer 41, the metal layer 42, and the metal nitride layer 43 through the interconnect structure. It is noted that only a single sequence of the metal oxide layer 41, the metal layer 42, and the metal nitride layer 43 has been depicted in FIG. 4 for simplicity purposes, but the performance that is being described with reference to FIG. 4 is equally applicable to liners composed of a superlattice structure, such as the liner structures depicted in FIGS. 2 and 3.

In the embodiments in which the metal nitride layer 43 is composed of manganese nitride ($MnN_y$), when the metal nitride layer 43 is in contact with the copper including structure 20, the manganese nitride minimizes the excess manganese diffusion from the manganese containing metal layer 42 to the copper including structure 20, which may be wiring or an interconnect. Manganese diffusion is depicted by the arrow extending from the metal layer 42 in the direction towards the copper including structure 20. In the embodiments when a cap is present on an upper surface of the copper including structure 20, manganese in the form of manganese nitride from the metal nitride layer 43, or manganese metal from the metal layer 42, acts as an oxygen getter as the heat of formation of manganese oxide (facilitates formation of oxide) is smaller than the heat of formation for copper oxide. Manganese has multiple oxidation states and forms oxide easily compared to formation of copper which has single oxidation state.

More specifically, the manganese diffuses into contact with oxygen present in the composite liner 40, the low-k dielectric material 30 and/or the copper including structure 20, wherein the manganese and oxygen react to form manganese oxide. Manganese has a higher affinity for oxygen than copper. The preferential formation of manganese oxide reduces the formation of copper oxide, therefore reducing the incidence of oxidation of the copper including structure 20.

As depicted by the arrows in FIG. 4 that lead to the upper surface of the copper including structure 20, in some embodiments, manganese may diffuse from the metal nitride layer 43 through the copper including structure 20 to the upper surface of the copper including structure 20. The manganese that diffused to the upper surface of the copper including structure 20 may react with oxygen from the atmosphere. Because the affinity of manganese to react with oxygen is greater than the affinity of copper to react with oxygen, the presence of the manganese that has diffused to the upper surface of the copper including structure 20 reduces the incidence of copper oxidation as the upper surface of the copper including structure 20.

The manganese that is present in the composite liner 40, e.g., present in the metal layer 42, is an excellent self forming barrier layer. As depicted by the arrow extending towards the low-k dielectric material 30 that is depicted in FIG. 4, manganese that diffuses to the low-k dielectric material 30, e.g., from the manganese metal layer 42, forms $MnSi_xO_y$ (dielectric), which is a diffusion barrier to copper. In some examples, when oxygen from the low-k dielectric material 30, e.g., pSiCOH, penetrates through the metal oxide layer 41, e.g., a metal oxide layer 41 composed of manganese oxide ($MnO_x$) manganese can react (oxygen getter) and form an additional barrier layer of manganese oxide ($MnO_x$) The additional layer of manganese oxide ($MnO_x$) may be present between the metal oxide layer 41 and the metal layer 42, and can serve as a diffusion barrier to obstruct further diffusion of oxygen from the low-k dielectric material 30 through the composite liner 40. In some embodiments, the additional layer of manganese oxide ($MnO_x$) may be in direct contact with the metal oxide layer 41 and the metal layer 42.

The metal nitride layer 43 composed of manganese nitride that interfaces with copper including structure 20 is a good copper diffusion diffusion barrier, and has strong adhesion to the copper including structure 20. The metal nitride layer 43 may also function as a seed layer for the forming of the copper including structure 20.

Each layer of the liner 40 can be made very thin (1-1.5 Å to few nm) due to self forming barrier properties of the individual layers.

Figure 5:
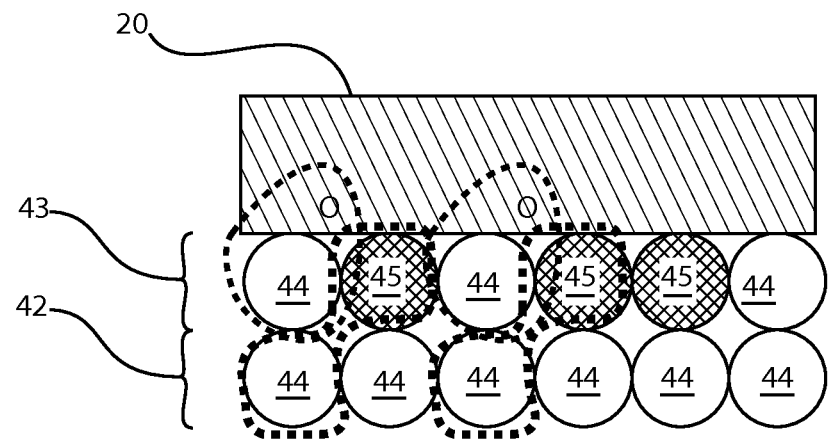
FIG. 5 is a schematic view depicting diffusion at the interface of the copper including interconnect and the superlattice structure, in accordance with one embodiment of the present disclosure.

FIG. 5 depicts one embodiment of intermixing of the metal elements of the metal nitride layer 43 and the metal layer 42 at the interface of the copper including structure 20 and the composite liner/superlattice structure. Intermixing of the metal elements does not necessarily require diffusion of atoms through the layers of the composite liner/liner including the superlattice structure. For example, the intermixing of the metal elements may suggest a bonding exchange between monolayer structures. The metal elements in the metal layer 42 and the metal nitride layer 43 may be manganese atoms 44. In addition to the metal elements, the metal nitride layer 43 further includes nitrogen atoms 45.

FIG. 5 depicts that the metal nitride layer 43, e.g., manganese nitride layer, that interfaces with the copper including structure 20 on one side of the metal nitride layer 43 and interfaces with the metal layer 42, e.g., manganese layer, on the opposing side of the metal nitride layer 43. In some embodiments, the manganese atoms 44 from the metal layer 42 can react with the nitrogen atoms 45 of the adjacent metal nitride layer 43 resulting in manganese atoms being available in the manganese nitride layer 43, which can now bond with oxygen on the interface with the copper including structure 20 acting as an oxygen getter. The oxygen getter reduces the oxidation of copper in the copper including structure 20.

Figure 6:
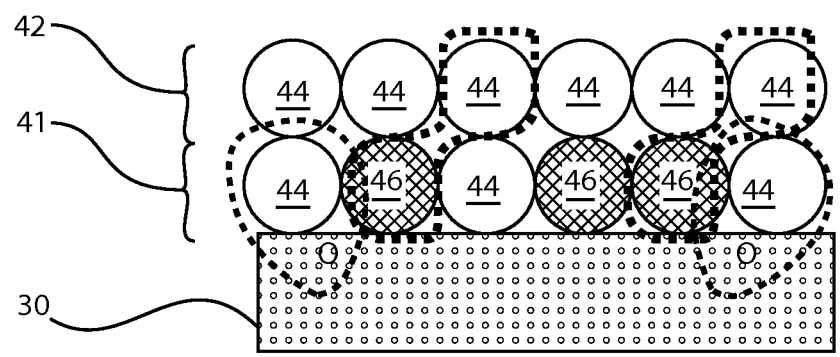
FIG. 6 is a schematic view depicting diffusion at the interface between the low-k dielectric material and the superlattice structure, in accordance with one embodiment of the present disclosure.

FIG. 6 depicts intermixing of the metal elements at the interface between the low-k dielectric material 30 and the metal oxide layer 41 of the composite liner/superlattice structure. The metal elements in the metal layer 42 and the metal oxide layer 41 may be manganese atoms 44. In addition to the metal elements, the metal oxide layer 41 further includes oxygen atoms 46. In one embodiment, the manganese oxide layer 41 is interfacing with the low-k dielectric layer 30 on one side, and is interfacing the metal layer 42, e.g., metal layer 42 composed of manganese, on the opposite side of the metal oxide layer 41. In some embodiments, the manganese atoms 44 from the metal layer 42, e.g., manganese metal layer 42, can react with oxygen atoms 46 from the adjacement metal oxide layer 41, e.g., manganese oxide layer, resulting in a manganese atom 44 being available in the metal oxide layer 41 that can now bond with oxygen from the low-k dielectric layer 30. The bonding of oxygen atoms 46 and manganese atoms 44 in this manner results in the formation of an additional manganese oxide barrier layer.

In another aspect of the present disclosure, a method of forming an interconnect structure of an electrical device is provided. In some embodiments, the method includes forming a liner including a sequence of a metal oxide layer, a metal layer, and a metal nitride layer on a low-k dielectric material, wherein at least one of the metal oxide layer, the metal layer, and the metal nitride layer includes manganese. In some embodiments, the sequence of the metal oxide layer, the metal layer and the metal nitride layer provides a superlattice structure including a repeating sequence of the metal oxide layer, the metal layer and the metal nitride layer. In one example, the metal oxide layer is manganese oxide, the metal layer is manganese, and the metal nitride layer is manganese nitride.

Figure 7:
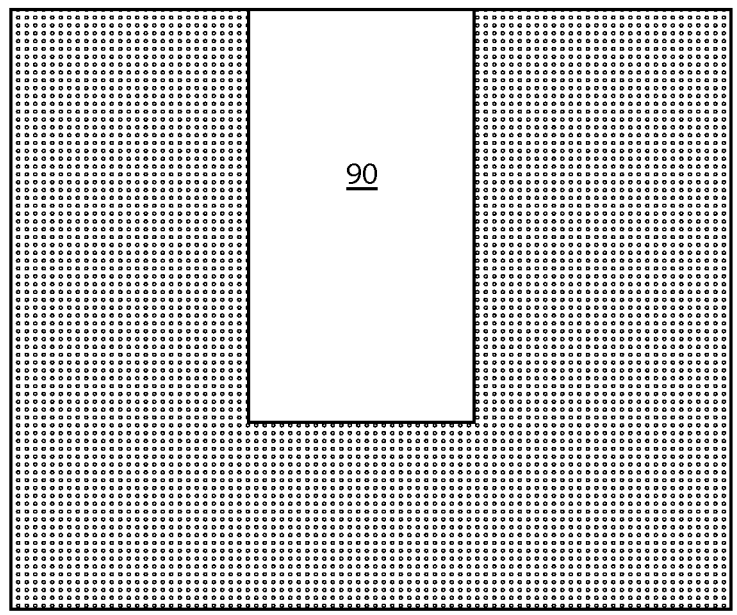
FIG. 7 is a side cross-sectional view depicting one embodiment of forming a trench in a low-k dielectric material, in accordance with the method of the present disclosure.

In some embodiments, prior to forming the liner including the sequence of the metal oxide layer and the metal layer and the metal nitride layer, a trench 90 is formed in the low-k dielectric material 30, as depicted in FIG. 7. The low-k dielectric material 30 may be formed on a substrate (not shown), such as a semiconductor or insulating substrate, using a deposition process, such as chemical vapor deposition, plasma enhanced chemical vapor deposition, chemical solution deposition, physical vapor deposition, and spin one deposition. The trench 90 may than be formed in the low-k dielectric material 30 using deposition, photolithography and etch processes. Specifically, in some embodiments, a pattern is produced on the low-k dielectric material 30 by applying a photoresist to the surface to be etched; exposing the photoresist to a pattern of radiation; and then developing the pattern into the photoresist utilizing resist developer. Once the patterning of the photoresist is completed, the sections of the low-k dielectric material 30 that are covered by the photoresist are protected while the exposed regions are removed using a selective etching process that removes the unprotected regions. The etch process may be an anisotropic etch, such as reactive ion etch. After forming the trench 90, the photoresist mask may be removed using chemical stripping, selective etching or oxygen ashing.

Figure 8:
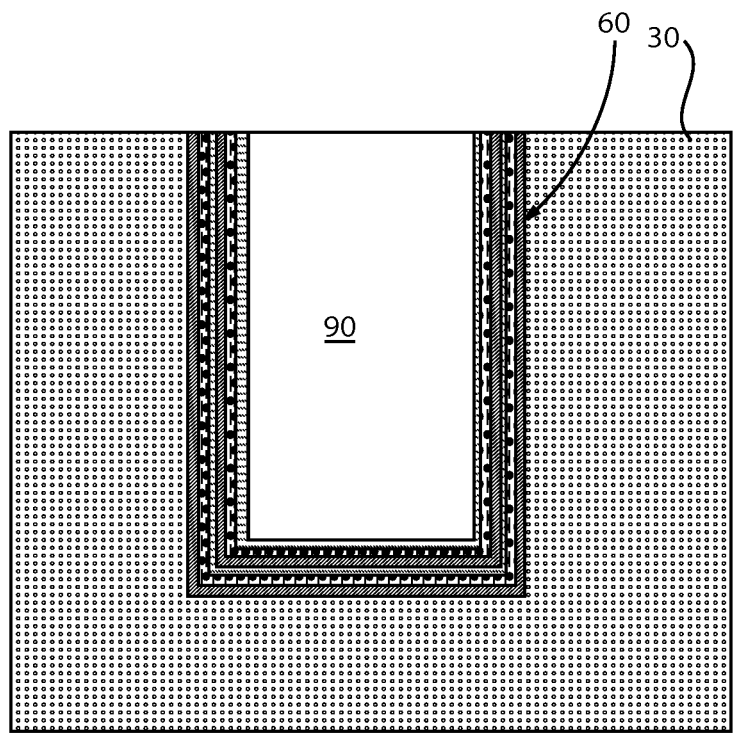
FIG. 8 is a side cross-sectional view depicting one embodiment of forming a liner of a superlattice structure including at least one manganese containing layer in the trench, in accordance with the present disclosure.

FIG. 8 depicts one embodiment of forming a liner of a superlattice structure 60 including at least one manganese containing layer in the trench 90. Although FIG. 8 depicts forming a superlattice structure 60 for the liner, the method is not limited to only this embodiment. For example, instead of a repeating sequence of the metal oxide layer, the metal layer, and the metal nitride layer that is present in the superlattice structure 60, the liner may be composed of a single sequence of a metal oxide layer, metal layer, and metal nitride layer in a composite liner consistent with the embodiments of the present disclosure described above with reference to FIG. 1. Whether the liner includes includes a single sequence or a repeating sequence of the metal oxide layer, metal layer, and the metal nitride layer, the liner is formed using a deposition process that starts with forming the metal oxide layer, e.g., manganese oxide layer, on a surface of the trench 90. For example, the metal oxide layer may be formed on a base surface and sidewall surface of the trench provided by an etched portion of the low-k dielectric material 30.

The deposition process for forming the material layer for the superlattice structure 60/composite liner is typically a conformal deposition process that is capable of depositing individual layers at a thickness of 10 Å or less.

In some embodiments, the deposition method for forming material layers for the superlattice structure 60, or the material layers from the composite liner, may include chemical vapor deposition (CVD), atomic layer deposition (ALD), plasma enhanced atomic layer deposition (ALD) or a combination thereof.

Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. One example of a CVD process for forming the metal oxide layer, metal layer and metal nitride layer of the super latttice structure is plasma enhanced chemical vapor deposition.

In chemical vapor deposition (CVD), the desired layer is deposited on the substrate from vaporized metal precursor compounds and any reaction gases used within a deposition chamber with no effort made to separate the reaction components.

"Atomic layer deposition" (ALD) as used herein refers to a vapor deposition process in which numerous consecutive deposition cycles are conducted in a deposition chamber. Typically, during each cycle a metal precursor is chemisorbed to the substrate surface, i.e., surface of the low-k dielectric material 30; excess precursor is purged out; a subsequent precursor and/or reaction gas is introduced to react with the chemisorbed layer; and excess reaction gas (if used) and by-products are removed. "Chemisorption" and "chemisorbed" as used herein refer to the chemical adsorption of vaporized reactive precursor compounds on the deposition surface. The adsorbed species are bound to the deposition surface as a result of relatively strong binding forces characterized by high adsorption energies (>30 kcal/mol), comparable in strength to ordinary chemical bonds. The chemisorbed species are limited to the formation of a monolayer on the deposition surface.

In atomic layer deposition, one or more appropriate reactive precursor compounds are alternately introduced (e.g., pulsed) into a deposition chamber and chemisorbed onto the deposition surface. Each sequential introduction of a reactive precursor compound is typically separated by an inert carrier gas purge. Each precursor compound co-reaction adds a new atomic layer to previously deposited layers to form a cumulative solid layer. It should be understood, however, that atomic layer deposition can use one precursor compound and one reaction gas. As compared to the one cycle chemical vapor deposition process, the longer duration multi-cycle atomic layer deposition process allows for improved control of layer thickness by self-limiting layer growth and minimizing detrimental gas phase reactions by separation of the reaction components.

Typically, atomic layer deposition is a self-limiting (the amount of film material deposited in each reaction cycle is constant), sequential surface chemistry that deposits conformal thin-films of materials onto deposition surfaces of varying compositions. For example, atomic layer deposition may provide for the deposition of a composition at one monolayer at a time. Atomic layer deposition is similar in chemistry to chemical vapor deposition, except that the atomic layer deposition reaction breaks the chemical vapor deposition reaction into two half-reactions, keeping the precursor materials separate during the reaction.

The metal precursor for deposition at least one of the metal nitride layer, the metal layer and the metal oxide layer of the superlattice structure 60 includes a metal precursor of at least one of metal carbonyl, metal amidinate, metal carbo-cyclopentadienyl and a combination thereof. The aforementioned metal precursor may introduce a manganese source for depositing a manganese containing layer including a manganese metal layer, a manganese oxide layer and/or a manganese nitride layer. To provide the oxygen and nitrogen source for the metal nitride layer and the metal oxide layer of the superlattice structure 60, further reactants such as ammonia gas ($NH_3$) and oxygen gas ($O_2$) may be introduced with the metal containing gas reactants. For example, the ammonia gas ($NH_3$) may provide the nitrogen source for a metal nitride layer, such as manganese nitride. For example, the oxygen gas ($O_2$) may provide the oxygen source for the metal oxide layer, such as manganese oxide.

Forming the material layers for the superlattice structure 60, or the material layers from the composite liner, may be conducted in a single chamber of a deposition device, such as a CVD, ALD, or PEALD deposition device, in which the gas precursors and reactants are cycles to provide the different compositions of the material layers with the superlattice structure 60, or composite liner, that is formed within the trench 90. The multiple layers for the superlattice structure 60, or composite liner, may be deposited within the deposition chamber without an air break between changes in the composition of the material layers being deposited. The final layer of the superlattice structure 60, or the composite liner, is typically a metal nitride layer, such as manganese nitride.

Following formation of the liner containing the superlattice structure 60, or the composite liner, the copper including structure 20 is formed within the trench 90 in direct contact with the final metal nitride layer of the liner containing the superlattice structure 60, or the composite liner. In some examples, the metal nitride layer of the superlattice structure 60, or the composite liner, may function as a seed layer for copper deposition or an adhesion promotor to copper.

The copper including structure 20 may be deposited using a physical vapor deposition method, such as plating or sputtering. In other embodiments, the copper including structure 20 may be deposited using a chemical vapor deposition method. Following deposition, the upper surface of the copper including structure 20 may be planarized, e.g., planarized by chemical mechanical planarization (CMP), to provide an upper surface that is coplanar with an upper surface of the liner containing the superlattice structure 60, and the super surface of the low-k dielectric material 30, as depicted in FIG. 2.

In some embodiments, in a following step, a cap 70 of a superlattice structure 60 may be formed on the upper surface of the copper including structure 20, as depicted in FIG. 3. Although FIG. 3 depicts forming a superlattice structure for the cap 70, the method is not limited to only this embodiment. For example, instead of a repeating sequence of the metal oxide layer, metal layer, and metal nitride layer that is present in the cap 70 of the superlattice structure, the liner may be composed of a single sequence of a metal oxide layer, metal layer, and metal nitride layer. The layers of the cap 70 may be formed using a deposition process, such as ALD, CVD, PEALD or a combination thereof, that is similar to the deposition process for forming the liner 60 that has been described above with reference to FIG. 8.

Having described preferred embodiments of a system and method of ultrathin superlattice of MnO/Mn/MnN and other metal oxide/metal/metal nitride liners and caps for copper low dielectric constant interconnects, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an interfacial layer between a low-k dielectric material and a copper including structure comprising:

forming a superlattice structure on the low-k dielectric material, wherein the superlattice structure includes a repeating sequence of a metal oxide layer, a metal layer and a metal nitride layer, wherein at least one of the metal oxide layer, the metal layer and the metal nitride layer comprise manganese (Mn), and a first layer of the superlattice structure that is in direct contact with the low-k dielectric material is one of said metal oxide layers; and forming the copper including structure on one of said metal nitride layers of said superlattice structure.

2. The method of claim 1, wherein forming the superlattice structure comprises depositing at least one of the metal nitride layer, the metal layer and the metal oxide layer using atomic layer deposition (ALD), chemical vapor deposition (CVD), plasma enhanced atomic layer deposition (PEALD) or a combination thereof.

3. The method of claim 1, wherein a metal precursor for deposition at least one of the metal nitride layer, the metal layer and the metal oxide layer comprises at least one of metal carbonyl, metal amidinate, metal carbo-cyclopentadienyl and a combination thereof with $NH_3$, $H_2$, $O_2$ bearing reactants.

4. The method of claim 1, wherein the metal nitride layer, the metal layer and the metal oxide layer of the superlattice structure are deposited in a same deposition chamber.

5. The method of claim 1, wherein each layer in the superlattice structure has a thickness of 10 Å or less.

6. The method of claim 1, wherein the metal nitride layer is manganese nitride, the metal layer is manganese, and the metal oxide layer is manganese oxide.

7. The method of claim 1, wherein the metal oxide layer in the superlattice structure obstructs copper from diffusing into the low-k dielectric material from the copper including structure.

8. The method of claim 1, wherein at least one metal nitride layer in the superlattice structure provides at least one of an oxygen diffusion barrier that prevents oxygen from diffusing into the copper including structure, a copper diffusion barrier that prevents copper from diffusing into the low-k dielectric material, and an adhesion promotor for adhesion to the copper including structure.

* * * * *